United States Patent
Gauthier, Jr. et al.

(10) Patent No.: US 9,431,388 B1
(45) Date of Patent: Aug. 30, 2016

(54) SERIES-CONNECTED NANOWIRE STRUCTURES

(71) Applicant: INTERNATIONAL BUSINESS MACHINES CORPORATION, Armonk, NY (US)

(72) Inventors: Robert J. Gauthier, Jr., Hinesburg, VT (US); Terence B. Hook, Jericho, VT (US); Souvick Mitra, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/699,034

(22) Filed: Apr. 29, 2015

(51) Int. Cl.
| | |
|---|---|
| *H01L 27/12* | (2006.01) |
| *H01L 27/02* | (2006.01) |
| *H01L 29/06* | (2006.01) |
| *H01L 29/423* | (2006.01) |
| *H01L 29/786* | (2006.01) |
| *H01L 27/092* | (2006.01) |
| *H01L 27/06* | (2006.01) |

(52) U.S. Cl.
CPC ....... *H01L 27/0255* (2013.01); *H01L 27/0629* (2013.01); *H01L 27/092* (2013.01); *H01L 29/0649* (2013.01); *H01L 29/0673* (2013.01); *H01L 29/42392* (2013.01); *H01L 29/78618* (2013.01); *H01L 29/78654* (2013.01); *H01L 29/78696* (2013.01)

(58) Field of Classification Search
CPC ... H01L 21/84; H01L 27/0688; H01L 27/11; H01L 27/1104; H01L 27/1203; H01L 27/0255; H01L 27/0629; H01L 27/092; H01L 27/0649; H01L 29/0673; H01L 29/42392; H01L 29/78618; H01L 29/78654; H01L 29/78696

USPC ............. 257/351, 24, 29; 438/17, 151, 157; 136/200, 212; 365/163

See application file for complete search history.

(56) References Cited

U.S. PATENT DOCUMENTS

| | | | |
|---|---|---|---|
| 7,576,384 B2 | 8/2009 | Gidon | |
| 8,084,308 B2 | 12/2011 | Chang et al. | |
| 8,324,940 B2 | 12/2012 | Bangsaruntip et al. | |
| 8,395,901 B2 | 3/2013 | Tour et al. | |
| 8,710,485 B2 | 4/2014 | Saitoh et al. | |
| 8,809,957 B2 * | 8/2014 | Bangsaruntip | B82Y 10/00 257/351 |
| 2011/0031473 A1 * | 2/2011 | Chang | B82Y 10/00 257/24 |
| 2011/0122682 A1 * | 5/2011 | Elmegreen | B82Y 10/00 365/163 |

(Continued)

OTHER PUBLICATIONS

Hubert et al., "A stacked SONOS technology, up to 4 levels and 6nm crystalline nanowires, with gate-all-around or independent gates (φ-Flash), suitable for full 3D integration", IEEE, 2009, pp. 27.6.1-27.6.4.

(Continued)

*Primary Examiner* — Mohammed Shamsuzzaman (74) *Attorney, Agent, or Firm* — Michael LeStrange; Andrew M. Calderon; Roberts Mlotkowski Safran Cole & Calderon, P.C.

(57) ABSTRACT

Series-connected nanowire structures and methods of manufacture are disclosed. The structure includes a plurality of vertically stacked nanowires extending through a gate structure. The structure further includes a plurality of conductively doped contacts connecting to the stacked nanowires in a series configuration.

5 Claims, 7 Drawing Sheets

(56) References Cited

U.S. PATENT DOCUMENTS

| | | | |
|---|---|---|---|
| 2014/0043060 A1* | 2/2014 | Amaru | H03K 19/20 326/36 |
| 2014/0060601 A1* | 3/2014 | Gotsmann | H01L 35/28 136/200 |
| 2014/0077156 A1 | 3/2014 | Bavencove et al. | |
| 2014/0217364 A1 | 8/2014 | Chang et al. | |
| 2014/0239255 A1 | 8/2014 | Kang et al. | |
| 2015/0372115 A1* | 12/2015 | Koh | H01L 29/6656 438/301 |
| 2016/0079508 A1* | 3/2016 | Kim | H01L 35/34 136/212 |

OTHER PUBLICATIONS

Javey et al., "Layer-by-Layer Assembly of Nanowires for Three-Dimensional, Multifunctional Electronics", Nano Lett., Feb. 2007, pp. 773-777.

Ng. et al., "Vertically Stacked Silicon Nanowire Transistors Fabricated by Inductive Plasma Etching and Stress-Limited Oxidation", IEEE Mar. 2009, pp. 520-522, vol. 30, Issue 5.

Dornel, et al., "Hydrogen Annealing of Arrays of Planar and Vertically Stacked Si Nanowires", Applied Physics Letters 91, 233502, 2007, pp. 233502-1-233502-3.

\* cited by examiner

SERIES-CONNECTED NANOWIRE STRUCTURES

FIELD OF THE INVENTION

The invention relates to semiconductor structures and, more particularly, to series-connected nanowire structures and methods of manufacture.

BACKGROUND

To realize higher integration in semiconductor devices, it is necessary to reduce the size of the semiconductor. Consequently engineers have developed nanowire devices, e.g., field effect transistor (FET), which includes thin semiconductor regions entirely surrounded by the gate and doped portions that contact the channel region and serve as source and drain regions of the device.

In certain designs, the semiconductor, e.g., the active layer, may be composed of several nanowires, each being 5-10 nanometers in thickness and also separated by 5-10 nanometers. Normally all the wires are connected together external to the gated region and the wires operate in parallel for high drive current.

SUMMARY

In an aspect of the invention, a structure comprises a plurality of vertically stacked nanowires extending through a gate structure. The structure further comprises a plurality of conductively doped contacts connecting to the stacked nanowires in a series configuration.

In an aspect of the invention, a structure comprises a plurality of vertically stacked and released nanowires extending through a gate structure. The structure further comprises a plurality of conductive contacts electrically connecting to the stacked nanowires on different sides of the gate structure, in a series configuration.

In an aspect of the invention, a method comprises forming vertically stacked nanoscale wiring levels extending through a common gate structure; and forming contacts to serially connect the vertically stacked nanoscale wiring levels using epitaxial growth processes with doped material, on sides of the common gate structure.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to series-connected nanowire structures and methods of manufacture. More specifically, the present invention is directed to multiple stacked nanowires which offer the opportunity to perform 3D integration of different devices. For example, long-channel devices can be manufactured for analog and low-current applications; whereas, series diodes, e.g., a stack of n/p diodes, can be manufactured for ESD protection and other over-voltage applications. In additional embodiments, highly compact inverters can be manufactured.

It is advantageous in some locations to configure these wires in a series configuration rather than parallel so as to realize other transistor configurations. Accordingly, a technology of adapting a multiple-stack parallel set of nanowires into various series combinations is advantageous as provided herein. Accordingly and advantageously, by connecting the various nanowires in various ways, it is possible to achieve different functions and different devices.

The series-connected nanowire structures of the present invention can be manufactured in a number of ways using a number of different tools. In general, though, the methodologies and tools are used to form structures with dimensions in the micrometer and nanometer scale. The methodologies, i.e., technologies, employed to manufacture the series-connected nanowire structures have been adopted from integrated circuit (IC) technology. For example, the structures of the present invention are built on wafers and are realized in films of material patterned by photolithographic processes on the top of a wafer. In particular, the fabrication of the series-connected nanowire structures uses three basic building blocks: (i) deposition of thin films of material on a substrate, (ii) applying a patterned mask on top of the films by photolithographic imaging, and (iii) etching the films selectively to the mask. In more specific embodiments, the fabrication processes include providing vertically stacked nanowires independently connected by sequential selective epitaxial depositions and recessing processes as described herein.

Figure 1:
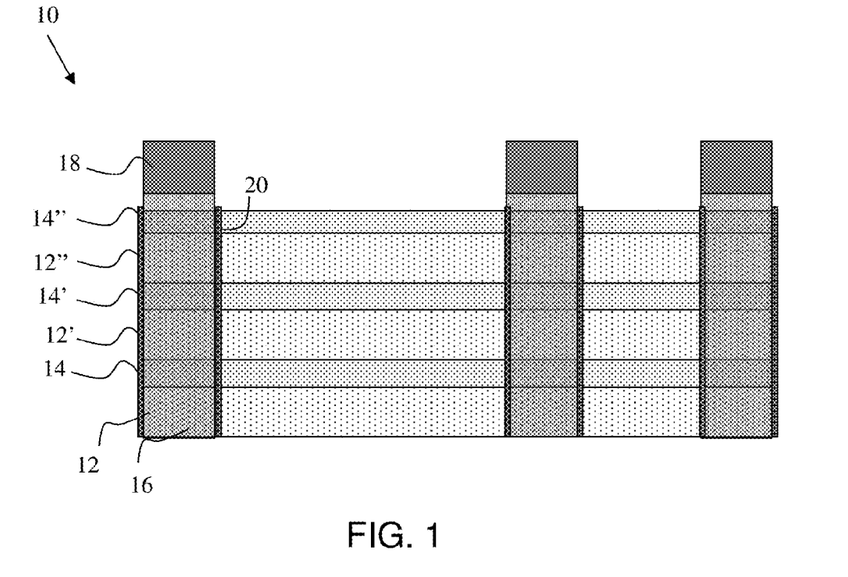
FIGS. 1-10 show fabrication processes for a series FET and respective structures in accordance with aspects of the present invention.

FIGS. 1-10 show fabrication processes for a series FET and respective structures in accordance with aspects of the present invention. More specifically, FIG. 1 shows a structure 10 with vertically stacked alternating layers 12, 14, 12', 14', 12" and 14" of semiconductor material. In embodiments, layers 12, 12' and 12" are SiGe material alternating with layers 14, 14' and 14" of Si material, forming a vertically stacked sandwiched structure. Although not shown, the alternating layers 12, 14, 12', 14', 12" and 14" can be formed on a substrate, e.g., oxide or other insulator material.

As described herein, the Si layers 14, 14' and 14" will form vertically stacked nanoscale wiring structures on the order of thickness or diameter of about 5 to 10 nanometers. It is also contemplated that other semiconductor materials can be used for the different alternating layers, noting that different semiconductor materials can be used to form the nanowires, as described further herein. It should also be understood by those of skill in the art that additional alternating layers are contemplated herein, with wiring connections in series in accordance with the many different aspects of the invention, including a series FET, a diode structure and an inverter, amongst other devices.

In embodiments, the sandwiched layers 12, 14, 12', 14', 12" and 14" can be formed using conventional deposition processes such as, for example, chemical vapor deposition (CVD) processes, followed by conventional lithography and etching processes to define device edges. In embodiments, the lithography and etching processes comprise a resist deposition process, following by a lithography process to form a pattern and a selective etching (reactive ion etching (RIE)) of the layers 12, 14, 12', 14', 12" and 14" through the pattern. After the etching process, the resist can be removed using oxygen ashing or other stripping processes.

Still referring to FIG. 1, dummy gate structures 16 are formed over the sandwiched layers 12, 14, 12', 14', 12" and 14", in an orthogonal orientation. As an example of forming the dummy gate structures 16, polysilicon material can be blanket deposited on the patterned layers with conventional CVD processes. A capping material 18, e.g., nitride cap, is deposited on the polysilicon material, followed by conventional lithography and etching processes to define the dummy gate structures 16, orthogonal to the patterned layers 12, 14, 12', 14', 12" and 14". Following the patterning of the dummy gate structures 16, spacer material 20 is formed on sidewalls of the dummy gate structures 16. The spacer material 20 can be, e.g., nitride, deposited using conventional deposition processes.

Figure 2:
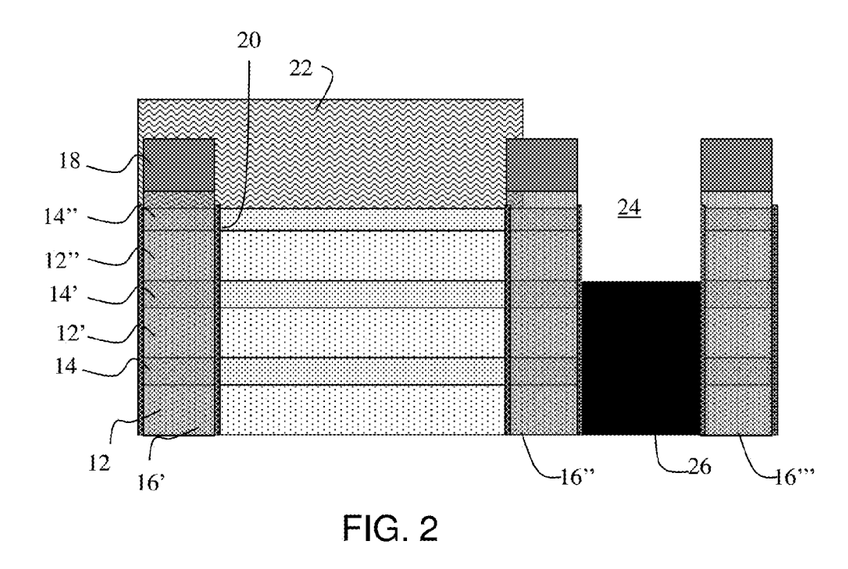

In FIG. 2, a mask 22 (e.g., oxide mask) is formed on and between dummy gate structures 16' and 16". An opening 24 is formed on the exposed side of the structure using lithography and etching processes followed by an epitaxial growth process to form a P+ structure 26. Removal of the wires in this region prior to epitaxy may be advantageous. In embodiments, the P+ structure 26 is approximately 30-40 nm tall and of width spanning the gate-gate spacing. The P+ structure 26 is a conductive structure electrically and directly connecting wiring layers 14 and 14' and 14". The epitaxial growth process is performed with a P+ doped material, e.g., boron; although other conductive materials are also contemplated by the present invention depending on the device characteristics. After the growth process, the epitaxial material is recessed to a level below the wiring layer 14".

Figure 3:
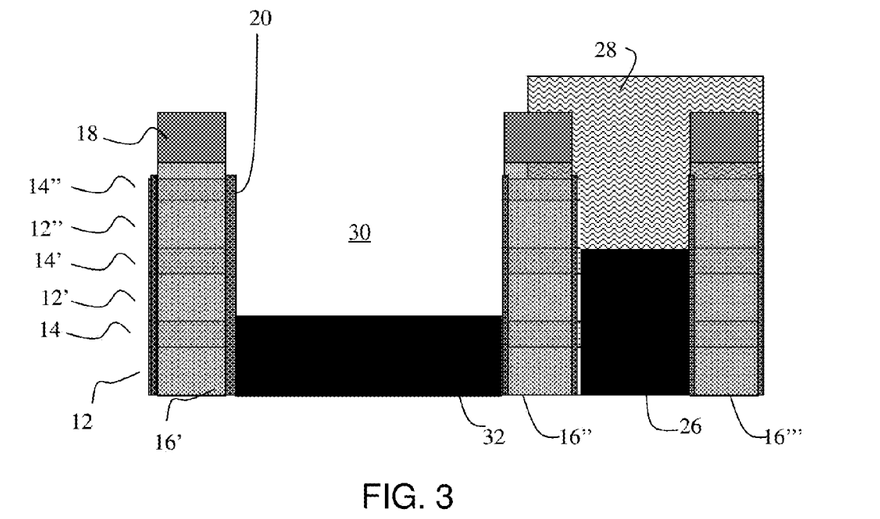

In FIG. 3, the mask shown in FIG. 2 is removed using conventional stripping processes, followed by formation of a mask 28 on and between dummy gate structures 16" and 16'''. In embodiments, the mask 28 can be an oxide material. An opening 30 is formed using conventional lithography and etching processes as described herein. Following the formation of the opening, an epitaxial growth process is performed with a P+ doped material, e.g., boron, to form a conductive structure 32 electrically and directly connecting to wiring layer 14, 14' and 14"; although other conductive materials are also contemplated by the present invention depending on the device characteristics. After the growth process, the epitaxial material is recessed to a level below the wiring layer 14'.

Figure 4:
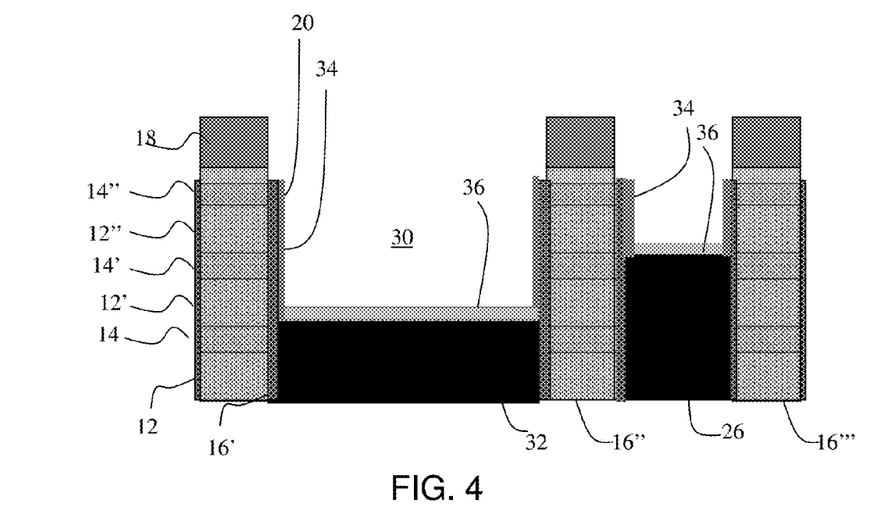

In FIG. 4, a protective sidewall layer 34 is deposited on the sidewalls of the dummy gate structures 16', 16" and 16'''. In embodiments, the protective sidewall layer 34 is nitride material, deposited using CVD processes as an example. Nitride material formed on the conductive epitaxial structures 26 and 32 is removed with anisotropic etching processes. An oxide layer 36 is formed on the conductive structures 26 and 32 using a thermal oxidation process.

Figure 5:
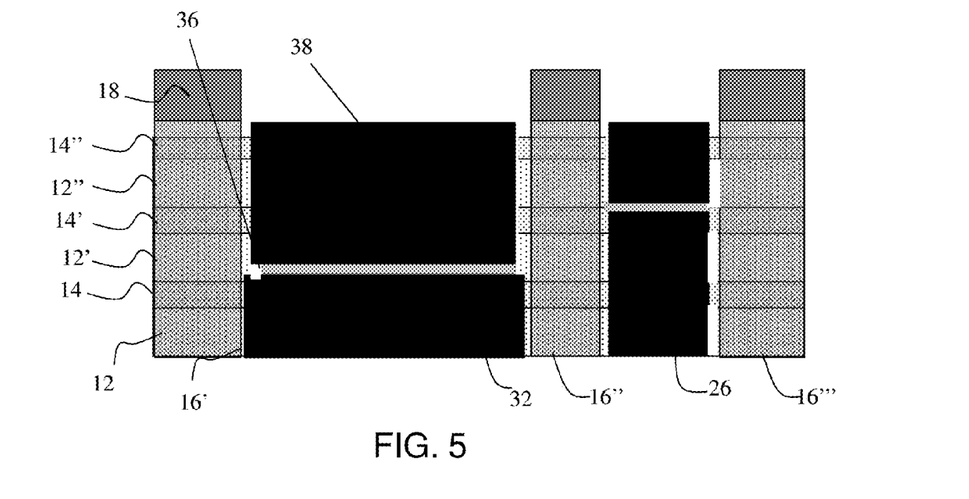

As shown in FIG. 5, the nitride sidewalls are removed using conventional etchants and etching processes. Using an epitaxial growth process, conductive structures 38 and 39 are formed on layer 36 on each side of the device, e.g., each side of a dummy structure 16". In embodiments, the conductive structure 38 electrically and directly connects the wiring layers 14' and 14"; whereas, the conductive structure 39 electrically and directly connects to the wiring layer 14". In embodiments, the epitaxial growth process is grown from the exposed wiring layers 14' and 14" and the material used in the growth process can be a P+ doped material, e.g., boron; although other conductive materials are also contemplated by the present invention depending on the device characteristics.

Figure 6:
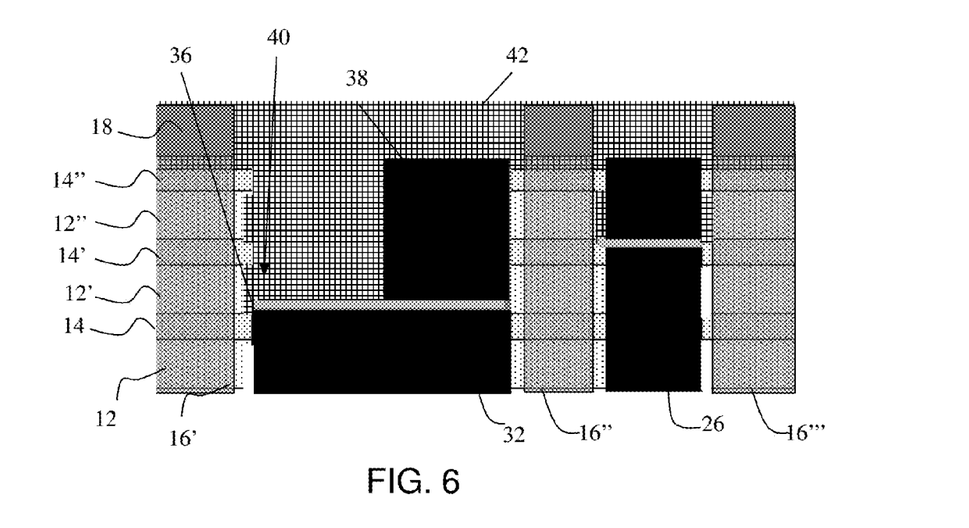

In FIG. 6, an opening 40 is formed in the conductive structure 38 using conventional lithography and etching processes as described herein. A dielectric material 42 is then deposited within the opening 40 and on remaining surfaces of the structure. The dielectric material 42 undergoes a planarizing process using conventional planarization techniques such as a chemical mechanical polishing (CMP).

Figure 7:
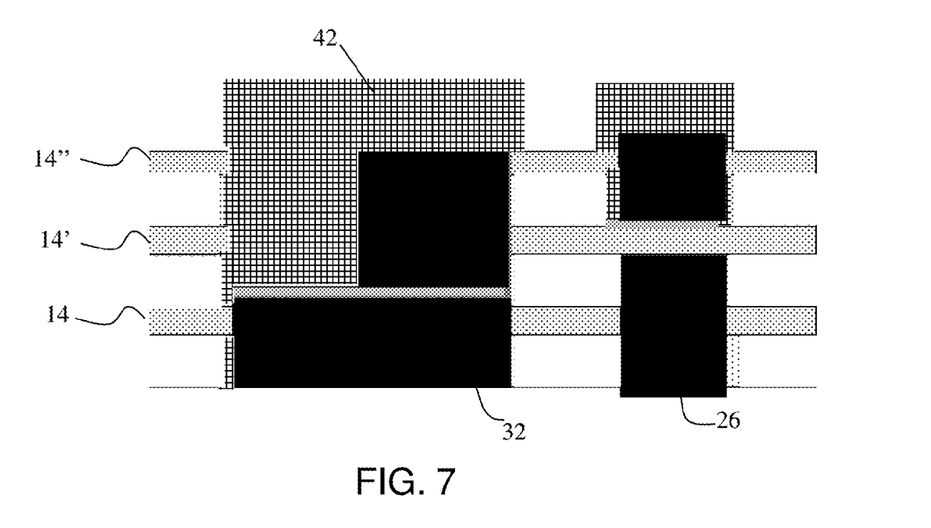

As shown in FIG. 7, the dummy gate structures are removed using conventional etching processes, selective to the dummy gate structures. The wiring layers 14, 14' and 14" (previously protected by the dummy gate structures) are then released using conventional etching processes, selective to the removal of exposed layers 12, 12' and 12". That is, unprotected or exposed layers 12, 12' and 12" are removed, leaving wiring layers 14, 14' and 14".

Figure 8:
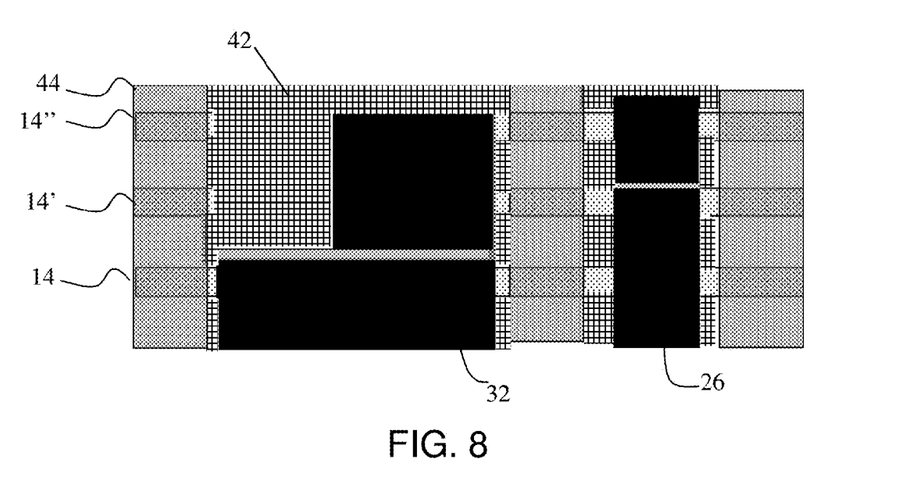

In FIG. 8, metal replacement gate structures 44 are formed using conventional deposition metal gate processes. For example, the metal replacement gate structures 44 can be a combination of different workfunction metals deposited using conventional deposition methods. Prior to the deposition of the workfunction metals, a gate dielectric material and sidewall spacers can be formed as should be understood by those of ordinary skill in the art. After the deposition process, the structure can undergo a polishing step such as, for example, CMP.

In alternate fabrication processes, the gate dielectric material could have been deposited during the fabrication of the dummy gate structure. Also, in embodiments, the sidewall spacers for the replacement gate structures 44 can be the spacers fabricated during the dummy gate structure processes, in which case, the workfunction metals for the replacement gate structures 44 can deposited between the spacers.

Figure 9:
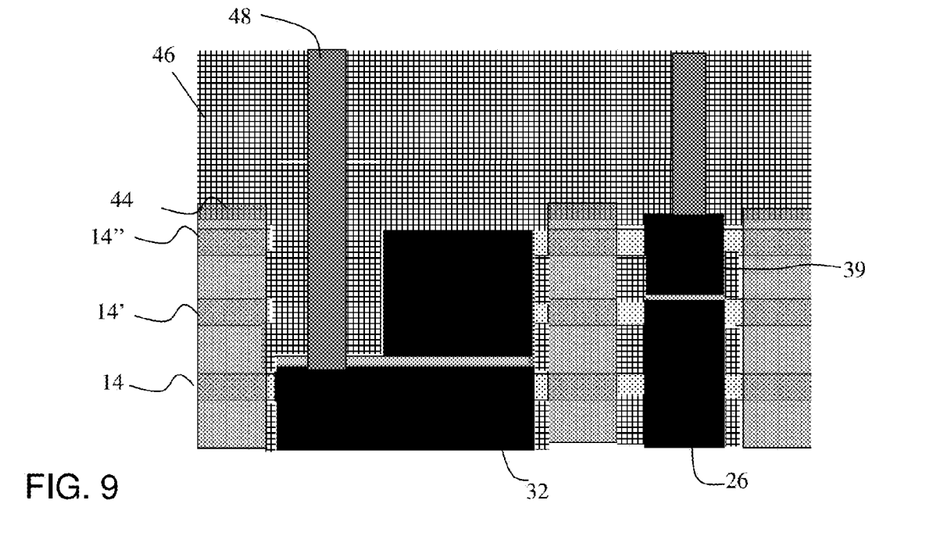
Figure 10:
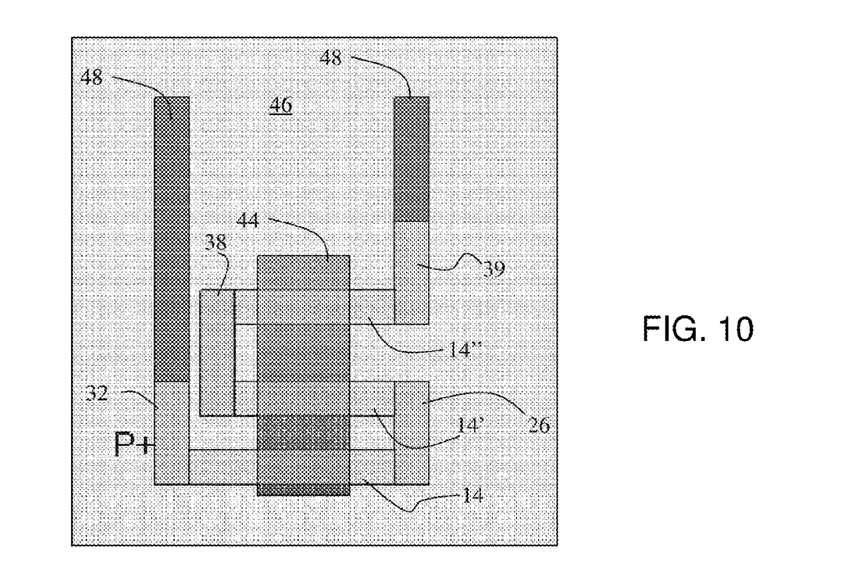

FIGS. 9 and 10 show the formation of contacts for the wiring structure in accordance with aspects of the present invention. As shown in these figures, a dielectric material 46 is deposited on the planarized surface of the structure of FIG. 8. Contacts 48 are formed within openings of the dielectric material 42, 46 and any intervening oxide layer(s) 36. In this way, the contacts 48 will electrically and directly contact the conductive structures 32 and 39. In embodiments, the contacts 48 are formed by conventional lithography, etching (RIE) and metal deposition processes (e.g., CVD), followed by a CMP process. In embodiments, the contacts 48 can be tungsten or other conductive material.

Figure 11:
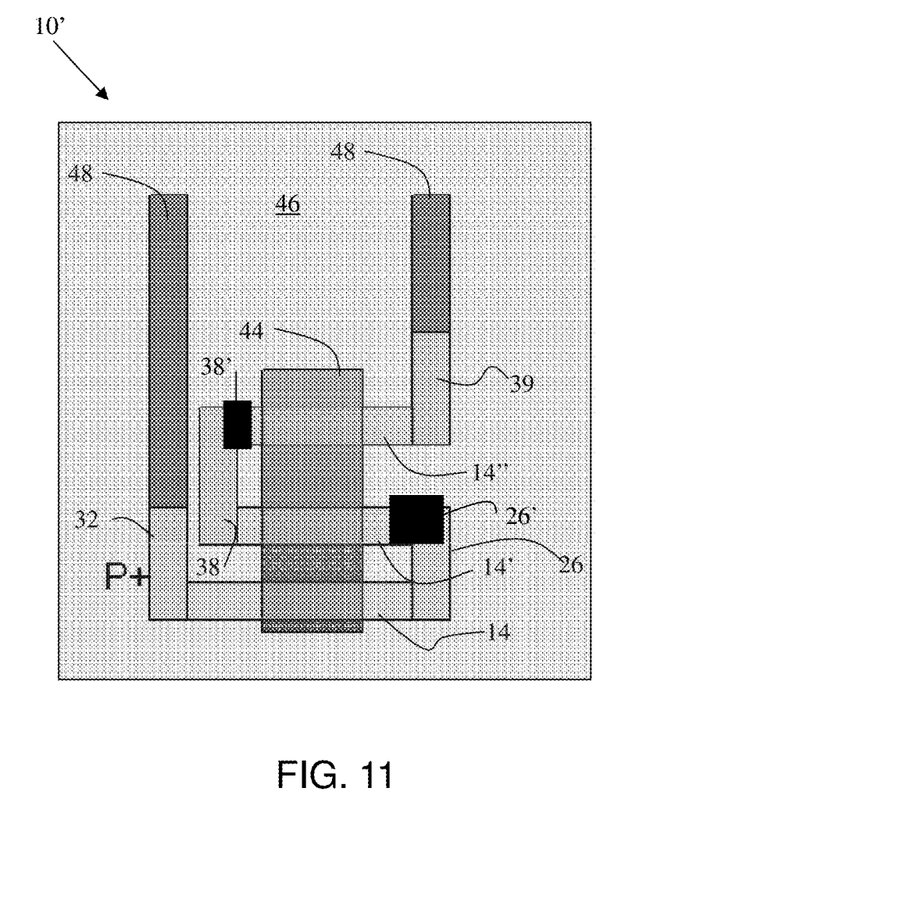
FIG. 11 shows fabrication processes and a resultant structure in accordance with additional aspects of the present invention.

FIG. 11 shows fabrication processes and a resultant structure in accordance with aspects of the present invention. More specifically, FIG. 11 shows the formation of a series diode 10'. Similar to the processes shown in FIGS. 1-10, a series wiring structure is formed in accordance with the above discussion with the addition of metal portions 26' and 38'. These metal portions 26' and 38' can be formed by metal deposition processes after the formation of the epitaxial processes forming the conductive structures 26 and 38. In embodiments, the metal portions 26' and 38' can be Molybdenum (Mo) or other metal that is capable of withstanding epitaxial thermal cycles. In addition, the wiring structure 26, 38 and 39 are an N+ doped material, e.g., arsenic (compared to a P+ doped material shown in the structure of FIG. 10).

Figure 12:
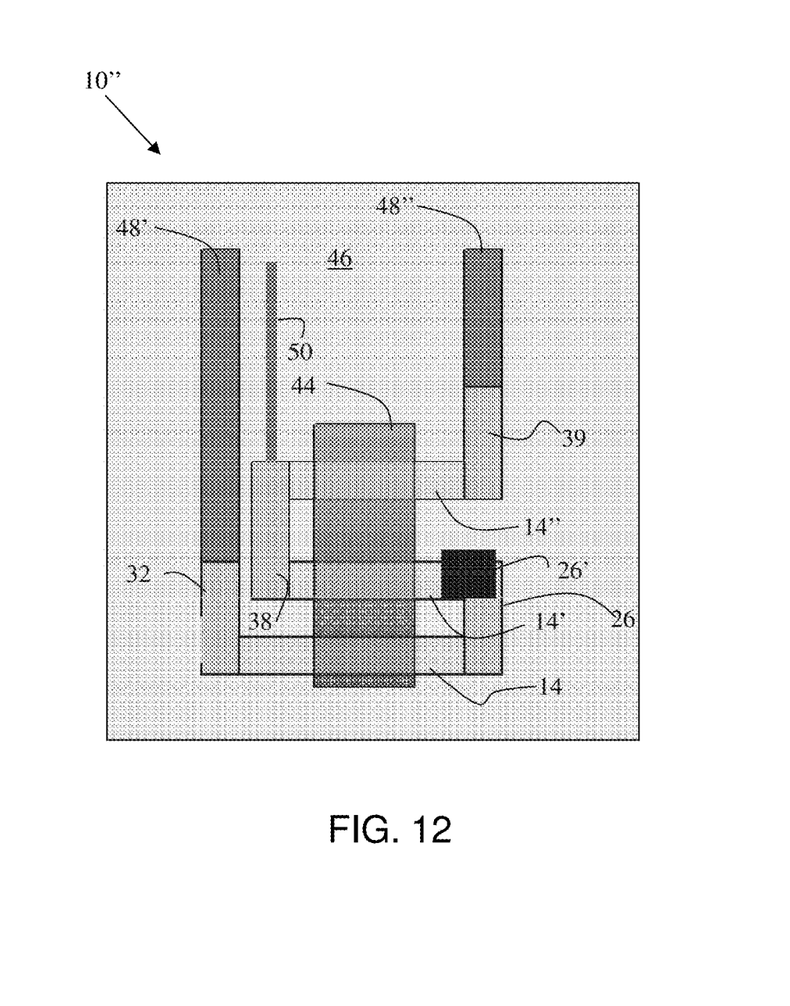
FIG. 12 shows fabrication processes and a resultant structure in accordance with additional aspects of the present invention.

FIG. 12 shows fabrication processes and a resultant structure in accordance with aspects of the present invention. More specifically, FIG. 12 shows the formation of an inverter 10'''. Similar to the processes shown in FIGS. 1-11, a series wiring structure is formed, now with the addition of metal portions 26' and a contact 50. The metal portion 26' can be formed by metal deposition processes after the formation of the epitaxial processes forming the structures 26. In embodiments, the metal portion 26' is Mo or other metals which are capable of withstanding epitaxial thermal cycles. In addition, the wiring structures 32 and 26 are an N+ doped material, e.g., arsenic; whereas, the wiring (conductive) structures 38 and 39 are a P+ doped material, e.g., boron. Moreover, the contact 50 is formed in electrical connection with the conductive structure 38. The contact 50 is an output of the inverter 10''; whereas, contact 48' is ground and contact 48'' is Vdd. In embodiments, the contact 50 can be formed in similar processing steps to that of contacts 48' and 48'', e.g., lithography, etching and deposition processes, followed by a CMP.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A semiconductor structure, comprising:
a plurality of vertically stacked and released nanowires extending through a common metal replacement gate structure; and a plurality of epitaxially grown conductively doped contacts electrically connecting to the stacked nanowires on different sides of the gate structure, in a series configuration;
wherein the plurality of conductively doped contacts comprise:
a first contact of the doped contacts electrically connecting a first nanowire to a second nanowire on a first side of the gate structure;
a second contact of the doped contacts electrically connecting to the first nanowire on a second side of the gate structure;
a third contact of the doped contacts electrically connecting the second nanowire to a third nanowire on the second side of the gate structure;
a fourth contact of the doped contacts electrically connecting to the third nanowire on the first side of the gate structure;
metal contacts electrically connecting the first contact and the second nanowire and the third contact and the third nanowire; and
the plurality of vertically stacked nanowires and the doped contacts share the common metal replacement gate structure.

2. The structure of claim 1, wherein the first, second, third and fourth contacts are P+ doped materials, forming a series FET.

3. The structure of claim 1, wherein the first contact is P+ doped material and the second, third and fourth contacts are N+ doped contacts, forming a series stacked diode.

4. The structure of claim 1, wherein the first and second contacts are N+ doped materials and the third and fourth contacts are P+ doped materials, forming an inverter.

5. The structure of claim 1, wherein the plurality of vertically stacked nanowires are semiconductor material.

* * * * *